(12) United States Patent
Qi et al.

(10) Patent No.: US 11,805,630 B2
(45) Date of Patent: Oct. 31, 2023

(54) DISPLAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yaya Qi, Beijing (CN); Dianzheng Dong, Beijing (CN); Yan Yan, Beijing (CN); Xiao Wang, Beijing (CN); Xue Wang, Beijing (CN); Tingting Wang, beijing (CN); Xiaoying Li, Beijing (CN); Zhiqiang Ma, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 79 days.

(21) Appl. No.: 17/433,164

(22) PCT Filed: Feb. 7, 2021

(86) PCT No.: PCT/CN2021/075809
§ 371 (c)(1),
(2) Date: Aug. 23, 2021

(87) PCT Pub. No.: WO2021/164597
PCT Pub. Date: Aug. 26, 2021

(65) Prior Publication Data
US 2022/0346291 A1    Oct. 27, 2022

(30) Foreign Application Priority Data
Feb. 19, 2020 (CN) .......................... 202010101579.6

(51) Int. Cl.
*H05K 9/00* (2006.01)
*H05F 3/00* (2006.01)

(52) U.S. Cl.
CPC ............. *H05K 9/0067* (2013.01); *H05F 3/00* (2013.01); *H05K 9/0064* (2013.01); *G02F 2202/22* (2013.01)

(58) Field of Classification Search
CPC .. H05K 9/0067; H05K 9/0054; H05K 1/0215; H05K 1/0259; H05K 9/0079; H05F 3/02; G09G 3/36; G09G 3/3607
(Continued)

(56) References Cited

U.S. PATENT DOCUMENTS

2010/0079693 A1    4/2010  Yoshida et al.
2015/0346570 A1*  12/2015  Choi ..................... G02F 1/1333
                                                    349/40
(Continued)

FOREIGN PATENT DOCUMENTS

CN    104656293 A    5/2015
CN    205452280 U    8/2016
(Continued)

OTHER PUBLICATIONS

First Office Action dated May 6, 2021 for application No. CN202010101579.6 with English translation attached.

*Primary Examiner* — Danny Nguyen
(74) *Attorney, Agent, or Firm* — Nath, Goldberg & Meyer; Joshua B. Goldberg

(57) ABSTRACT

The present disclosure provides a display substrate, including: a display area and a bonding area positioned on a side of the display area, the bonding area includes a plurality of bonding sub-areas arranged at intervals, the bonding sub-areas are arranged along a direction in which an edge of the display area extends and configured for bonding a chip-on- (Continued)

film, where a first antistatic layer is further arranged on the bonding area, at least a part of the first antistatic layer is positioned between adjacent ones of the bonding sub-areas, and the first antistatic layer is electrically coupled to a reference signal terminal. The present disclosure further provides a display device.

14 Claims, 3 Drawing Sheets

(58) Field of Classification Search
USPC .......................................... 361/56, 212, 220
See application file for complete search history.

(56) References Cited

U.S. PATENT DOCUMENTS

2018/0039123 A1* 2/2018 Kim .................... G02F 1/13338
2020/0401002 A1* 12/2020 Lu .............................. H05F 3/00
2021/0033908 A1* 2/2021 Qiu .................. G02F 1/133514

FOREIGN PATENT DOCUMENTS

| | | |
|---|---|---|
| CN | 106324882 A | 1/2017 |
| CN | 107247373 A | 10/2017 |
| CN | 107342284 A | 11/2017 |
| CN | 108766994 A | 11/2018 |
| CN | 109064902 A | 12/2018 |
| CN | 109671703 A | 4/2019 |
| CN | 109709731 A | 5/2019 |
| CN | 109979371 A | 7/2019 |
| CN | 110286513 A | 9/2019 |
| CN | 110471567 A | 11/2019 |
| CN | 209592036 U | 11/2019 |
| CN | 111179743 A | 5/2020 |
| JP | 2001281687 A | 10/2001 |

* cited by examiner

DISPLAY SUBSTRATE AND DISPLAY DEVICE

CROSS REFERENCE TO RELATED APPLICATIONS

This is a National Phase Application filed under 35 U.S.C. 371 as a national stage of PCT/CN2021/075809, filed Feb. 7, 2021, an application claiming the benefit of Chinese Application No. 202010101579.6, filed Feb. 19, 2020, the content of each of which is hereby incorporated by reference in its entirety.

TECHNICAL FIELD

The present disclosure relates to the field of display technology, and in particular to a display substrate and a display device.

BACKGROUND

The display substrate is continuously rubbed during the transportation and manufacturing process, resulting in continuous generation of static electricity on the display substrate. The base of the display substrate is made of an insulating glass material, static electricity is difficult to be discharged therefrom, and thus a large amount of electrostatic charges is easily accumulated on a surface of the display substrate, an electrostatic discharge phenomenon is generated under a specific condition, and after the electrostatic charges enter a display area, a signal line and other conductive structures in the display area are easily broken down, so that poor display is caused.

SUMMARY

The present disclosure provides a display substrate, including: a display area and a bonding area arranged at a side of the display area, where the bonding area includes a plurality of bonding sub-areas arranged at intervals, the bonding sub-areas are arranged along a direction in which an edge of the display area extends and configured for bonding a chip-on-film, the bonding area is provided with a first antistatic layer thereon, at least a part of the first antistatic layer is located between adjacent ones of the bonding sub-areas, and the first antistatic layer is electrically coupled to a reference signal terminal.

In some implementations, the display substrate further includes a signal terminal configured to provide a display signal to the display area, the signal terminal is located at a side of the bonding area proximal to the display area, and the signal terminal is located between the display area and the first antistatic layer and isolated from outside by the first antistatic layer.

In some implementations, the reference signal terminal is disposed on the bonding sub-area and configured to be capable of being electrically coupled to an external ground terminal through the chip-on-film.

In some implementations, the first antistatic layer includes a first antistatic sub-layer and a second antistatic sub-layer, the second antistatic sub-layer is disposed on a side of the first antistatic sub-layer proximal to the display area, and both the first antistatic sub-layer and the second antistatic sub-layer are electrically coupled to the reference signal terminal.

In some implementations, the first antistatic sub-layer is disposed electrically isolated from the second antistatic sub-layer.

In some implementations, the first antistatic layer is provided with a first through hole therein.

In some implementations, the first through hole is a stripe through hole.

In some implementations, the display substrate further includes a first frame area, a second frame area, and a third frame area, which are coupled in sequence, where the first frame area, the second frame area, the third frame area, and the bonding area surround the display area, and the first frame area, the second frame area, and the third frame area each are provided with a second antistatic layer thereon, and the second antistatic layer is electrically coupled to the reference signal terminal.

In some implementations, the display substrate further includes a conductive layer, the conductive layer includes a connection line and an auxiliary conductive portion coupled in parallel with the connection line, and the second antistatic layer is electrically coupled to the reference signal terminal through the connection line.

In some implementations, a second through hole is disposed in a position of the second antistatic layer, which is proximal to a corner of the display substrate, and an alignment mark is disposed in the second through hole for position alignment and adjustment.

The present disclosure further provides a display device including the display substrate described above, the display device further includes a chip-on-film, where one end of the chip-on-film is bound with the bonding sub-area, and another end of the chip-on-film is bound with a driving circuit board;

the driving circuit board is provided with a ground terminal thereon, and the reference signal terminal is electrically coupled to the ground terminal on the driving circuit board through the chip-on-film.

In some implementations, the first antistatic layer partially overlaps the chip-on-film adjacent to the first antistatic layer in a first direction, where the first direction is a direction along which the bonding area and the display area are arranged.

In some implementations, the chip-on-film includes a body portion and a protrusion portion protruding from the body portion towards the chip-on-film adjacent thereto;

the first antistatic sub-layer includes a first antistatic part, a second antistatic part and a third antistatic part, the second antistatic part is positioned between body portions of two adjacent chip-on-films, the first antistatic part is positioned on a side, away from the display area, of the second antistatic part, at least a portion of the first antistatic part is positioned between protruding portions of the two adjacent chip-on-films, and the third antistatic part is positioned on a side, proximal to the display area, of the second antistatic part.

In some implementations, the first antistatic part, the second antistatic part, and the third antistatic part are formed into an integral structure as a single piece.

DESCRIPTION OF DRAWINGS

The accompanying drawings, which are included to provide a further understanding of the present disclosure and are incorporated in and constitute a part of this specification, illustrate embodiments of the present disclosure and together with the description serve to explain the present disclosure, but do not constitute a limitation of the present disclosure. In the drawings.

DESCRIPTION OF EMBODIMENTS

The following detailed description of the embodiments of the present disclosure refers to the accompanying drawings. It should be understood that the detailed description and specific examples, while indicating the present disclosure, are given by way of illustration and explanation only, not limitation.

Unless otherwise defined, technical or scientific terms used in the embodiments of the present disclosure should have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the word "include", or "comprise", and the like, means that the element or item appearing before the word "include" or "comprise" and the like, includes the element or item listed after the word and its equivalents, but does not exclude other elements or items. The terms "connected" or "coupled" and the like are not restricted to physical or mechanical connections, but may include electrical connections, whether direct or indirect. Terms "up", "down", "left", "right", and the like are used only to indicate relative positional relationships, and when an absolute position of the object being described is changed, the relative positional relationships may also be changed accordingly.

Figure 1:
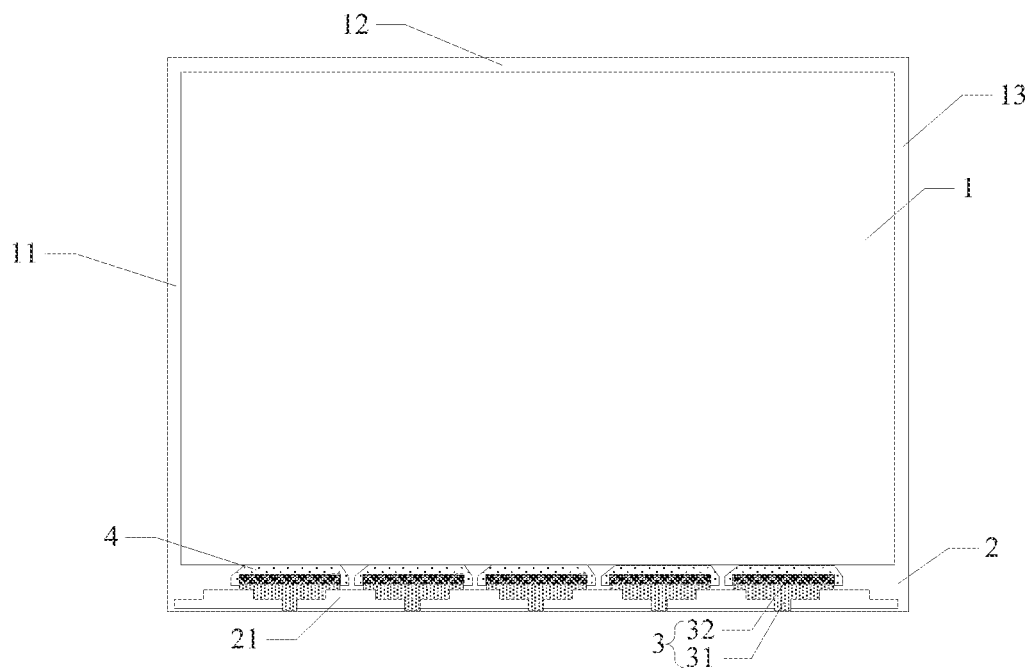
FIG. 1 is a schematic diagram of a display substrate according to an embodiment of the present disclosure.

The present disclosure provides a display substrate, and FIG. 1 is a schematic diagram of a display substrate according to an embodiment of the present disclosure, and as shown in FIG. 1, the display substrate includes: a display area 1 and a bonding area 2 located at a side of the display area 1. The bonding area 2 includes a plurality of bonding sub-areas 21 arranged at intervals, and the bonding sub-areas 21 are configured for bonding a chip-on-film (COF). The bonding area 2 is provided with a first antistatic layer 3 thereon, at least a part of the first antistatic layer 3 is located between adjacent ones of the bonding sub-areas 21, and the first antistatic layer 3 is electrically coupled to a reference signal terminal.

Specifically, as shown in FIG. 1, the first antistatic layer 3 may be made of a metal conductive material, the plurality of bonding sub-areas 21 in the bonding area 2 may be arranged along a direction (e.g., a left-right direction in FIG. 1) in which an edge of the display area. 1 extends, a certain distance exists between the adjacent ones of the bonding sub-areas 21, and each bonding sub-area 21 may be provided with a bonding electrode thereon, which is configured for being electrically coupled to a conductive portion on the chip-on-film, so as to receive a driving signal provided by the chip-on-film, and further provide a display signal for the display area 1. The reference signal terminal may be disposed on the bonding sub-area 21, the chip-on-film may be electrically coupled to a driving circuit board, and the reference signal terminal may be electrically coupled to a ground terminal on the driving circuit board through the chip-on-film. A signal terminal 4 may be further provided on a side of the bonding area 2 proximal to the display area 1, and in some implementations, the signal terminal 4 is a common signal terminal (VCOM) for providing a common voltage signal to a common signal line in the display area 1. At least a part of the signal terminal 4 may correspond to an interval between the bonding sub-areas 21, for example, at least a part of the signal terminal 4 may be positioned at a side of the first antistatic layer 3 proximal to the display area 1.

In the related art, static electricity generated during manufacturing, moving the display substrate or the like is easily conducted from intervals between the bonding sub-areas 21 to the signal terminal 4, and further conducted to the display area 1, so that a display failure may occur in the display area 1. In the embodiment of the present disclosure, at least a part of the first antistatic layer 3 is located between adjacent ones of the bonding sub-areas 21, so that when static electricity is generated between the adjacent ones of the bonding sub-areas 21, the first antistatic layer 3 can guide the static electricity to the ground terminal of the driving circuit board in time, thereby playing a role of electrostatic protection for the signal terminal 4 and improving the antistatic capability of the display substrate.

It should be noted that, in the embodiment of the present disclosure, a specific shape of the bonding sub-area 21 may be the same as a shape of a part of the chip-on-film bound to the bonding sub-area 21.

As shown in FIG. 1, the first antistatic layer 3 may include a first antistatic sub-layer 31 and a second antistatic sub-layer 32, the second antistatic sub-layer 32 may be disposed on a side of the first antistatic sub-layer 31 proximal to the display area 1, and both the first antistatic sub-layer 31 and the second antistatic sub-layer 32 are electrically coupled to the reference signal terminal. Specifically, the first antistatic sub-layer 31 and the second antistatic sub-layer 32 may be disposed to be electrically isolated from each other. When the first antistatic sub-layer 31 cannot completely lead out static electricity, the second antistatic sub-layer 32 can lead out remaining static electricity, so as to improve an effect of electrostatic protection.

Figure 2:
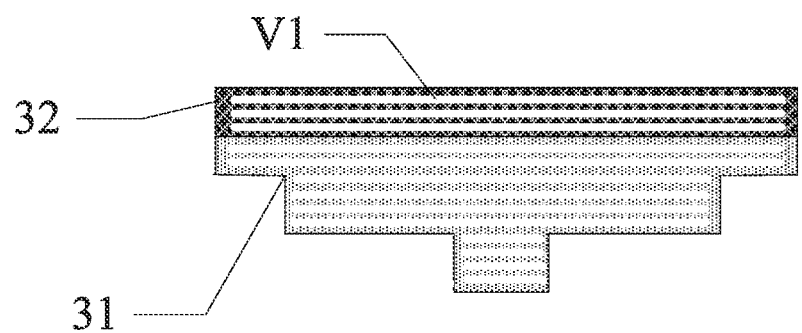
FIG. 2 is a schematic diagram illustrating a through hole being formed in a first antistatic layer according to an embodiment of the present disclosure.

In some implementations, the first antistatic layer 3 may have a first through hole formed therein. Specifically, FIG. 2 is a schematic diagram illustrating a through hole being disposed in the first antistatic layer according to an embodiment of the present disclosure. As shown in FIG. 2, a shape of the first through hole V1 may be a strip shape, and in fact, the shape of the first through hole V1 may also be a circle or a triangle, as needed, which is not limited herein. Because the first antistatic layer 3 may be made of a metal conductive material, and the metal conductive material has a certain light reflection property, a surface area of the first antistatic layer 3 can be reduced by arranging the first through hole V1 in the first antistatic layer 3, so that a problem of light reflection of the first antistatic layer 3 is improved; meanwhile, by arranging the first through holes V1, the first antistatic layer 3 can be in a mesh shape, so that paths for releasing static electricity are increased, the conductive capability of the first antistatic layer 3 is improved, and static electricity can be timely led out by the first antistatic layer 3. In some implementations, the first through hole V1 is a stripe through hole extending along a direction (for example, the left-right direction in FIG. 1) along which the plurality of bonding sub-areas 21 are arranged, but the first through hole V1 may also be a stripe through hole extending perpendicular to the direction in which the plurality of bonding sub-areas 21 are arranged, for example, a stripe through hole extending along an up-down direction in FIG. 1, or the first through hole V1 may also be a stripe through hole extending along any other direction, which is not limited herein.

Figure 3:
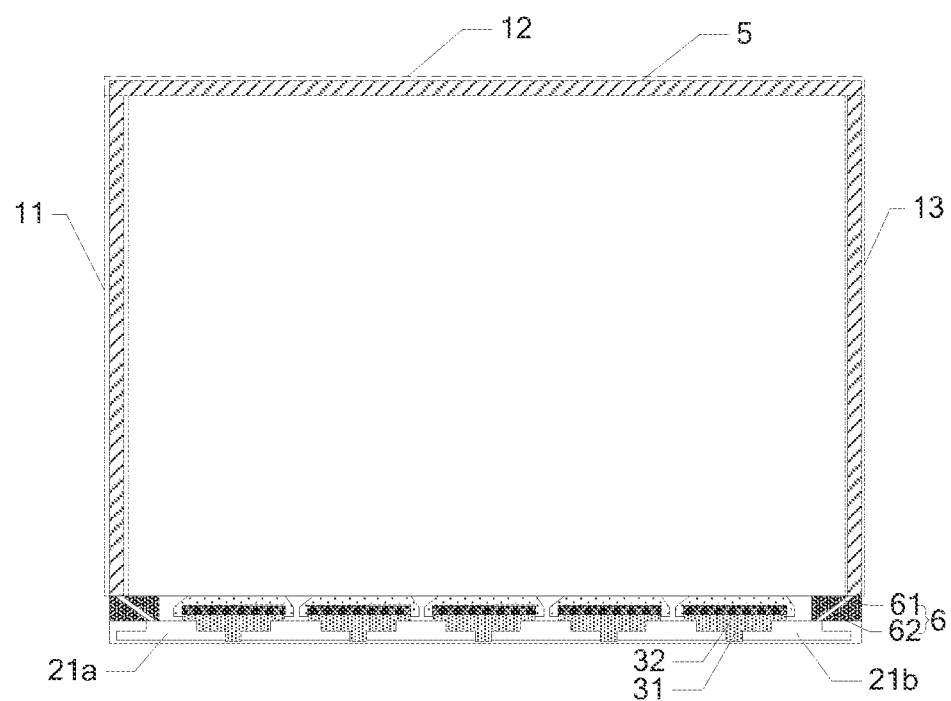
FIG. 3 is a schematic diagram of a display substrate according to an embodiment of the present disclosure.

FIG. 3 is a schematic diagram of a display substrate according to an embodiment of the present disclosure, as shown in FIG. 1 and FIG. 3, the display substrate further includes a first frame area. 11, a second frame area 12, and a third frame area 13 that are sequentially coupled, the first frame area 11, the second frame area 12, the third frame area 13, and the bonding area 2 surround the display area 1, for example, the first frame area 11 and the third frame area 13 are respectively located on two opposite sides of the display area 1, the second frame area 12 and the bonding area 2 are respectively located on two opposite sides of the display area 1, and the first frame area 11, the second frame area 12, and the third frame area 13 each may be provided with a second antistatic layer 5 thereon. The second antistatic layer 5 may also be electrically, coupled to the reference signal terminal in the bonding area 2.

Specifically, as shown in FIG. 3, parts of the second antistatic layer 5 in the first frame area 11, the second frame area 12, and the third frame area 13 may be respectively in a strip shape and may be formed into an integral structure as a single piece, the parts of the second antistatic layer 5 in the first frame area 11 and the third frame area 13 may respectively extend to two ends of the bonding area 2 along the first frame area. 11 and the third frame area. 13 and are respectively electrically coupled to reference signal terminals on the bonding sub-areas 21 adjacent thereto, for example, as shown in FIG. 3, the part of the second antistatic layer 5 in the first frame area 11 may be electrically, coupled to the reference signal terminal on the bonding sub-area 21a adjacent thereto, and the part of the second antistatic layer 5 in the third frame area 13 may be electrically coupled to the reference signal terminal on the bonding sub-area 21b adjacent thereto. By providing the second antistatic layer 5, electrostatic protection can be formed for three sides, in addition to the side where the bonding area 2 is located, of display substrate, so that the static electricity produced at any side of peripheral of the display substrate can be led out in time through corresponding antistatic layer (the first antistatic layer 3 or the second antistatic layer 5), and the antistatic effect of the display substrate is improved.

In some implementations, the display substrate according to the embodiment of the present disclosure may further include a conductive layer 6, as shown in FIG. 3, the conductive layer 6 includes a connection line 61 and an auxiliary conductive portion 62 coupled in parallel with the connection line 61, and the second antistatic layer 5 may be electrically coupled to the reference signal terminal through the connection line 61.

Specifically, the auxiliary conductive portion 62 may be disposed in the same layer as the connection line 61 and on two sides of the connection line 61, so that the connection line 61 and the auxiliary conductive portion 62 form an entire continuous conductive layer, and a connection resistance between the second antistatic layer 5 and the reference signal terminal is reduced. As can be seen from the formula $Q=I^2RT$ (Q represents heat, I represents current, R represents resistance, and T represents time), the smaller the resistance is, the smaller the amount of heat generated is, and the possibility that the connection line 61 is broken down can be reduced, thereby improving the antistatic ability of the display substrate.

In general, an alignment mark may be provided at an edge position of the display substrate, and the alignment mark may include a plurality of mark lines, forming a Vernier Mark. In the process of manufacturing, positions of a mask plate, an opposite substrate or other structures may be adjusted according to the alignment mark. The alignment mark is usually made of a metal material, which may cause electrostatic charges to be accumulated on the alignment mark, and after the electrostatic charges are accumulated to a certain extent, electrostatic discharge occurs, and a large instantaneous current may enter the second antistatic layer 5 adjacent thereto, which may easily cause the second antistatic layer 5 to be broken down, thereby causing poor display.

Figure 4:
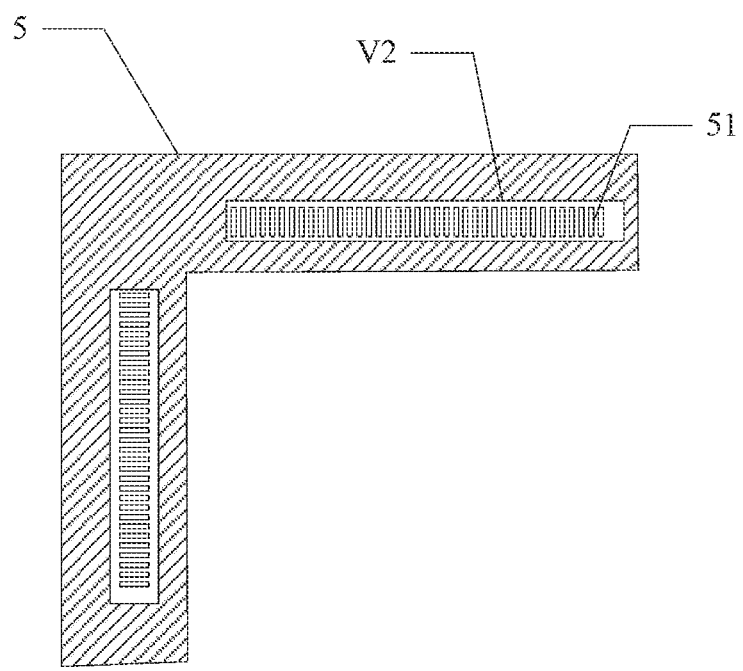
FIG. 4 is a schematic diagram of an alignment mark according to an embodiment of the present disclosure.

In order to prevent this phenomenon, in the embodiment of the present disclosure, the distance between the alignment mark and the edge of the display substrate may be increased, so as to improve the problem of electrostatic charge accumulation on the alignment mark. FIG. 4 is a schematic diagram of an alignment mark according to an embodiment of the present disclosure, and as shown in FIG. 4, a second through hole V2 may be disposed at a position of the second antistatic layer 5 proximal to a corner of the display substrate, and an alignment mark 51 may be disposed in the second through hole V2.

Compared with the alignment mark 51 being disposed at the edge of the display substrate, the alignment mark 51 disposed in the second through hole V2 in the embodiment of the present disclosure can increase the distance between the alignment mark 51 and the edge of the display substrate, so as to prevent the electrostatic charges from accumulating on the alignment mark 51 so that electrostatic discharge occurs to break down the second antistatic layer 5 nearby. It can be understood that the alignment mark may also be disposed on the opposite substrate for being disposed opposite to the display substrate, and after the distance between the alignment mark 51 on the display substrate and the edge of the display substrate is increased, the position of the alignment mark on the opposite substrate may also be adjusted accordingly, so that the alignment mark 51 on the display substrate corresponds to the alignment mark on the opposite substrate.

Certainly, in the embodiment of the present disclosure, the alignment mark 51 may also be directly removed, so as to prevent static electricity from entering the display substrate, and further prevent the second antistatic layer 5 from being broken down.

Figure 5:
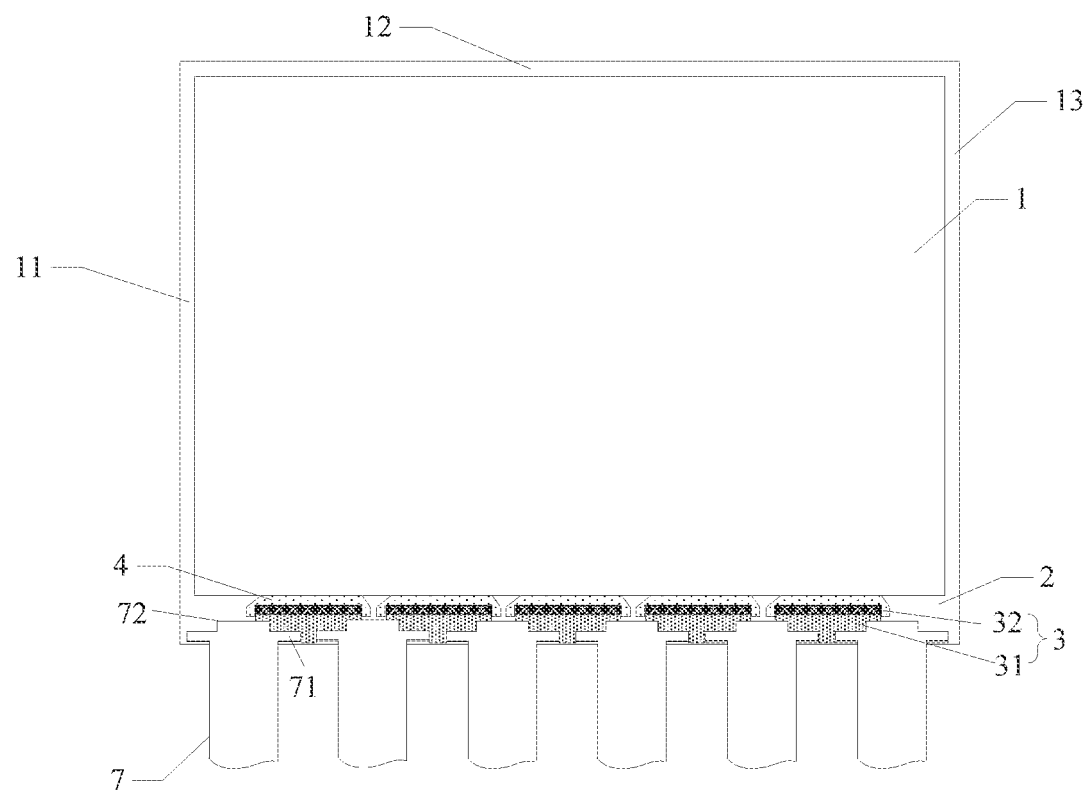
FIG. 5 is a schematic diagram of a display device according to an embodiment of the present disclosure.

An embodiment of the present disclosure further provides a display device, and FIG. 5 is a schematic diagram of a display device according to an embodiment of the present disclosure. As shown in FIG. 5, the display device includes the display substrate of the above embodiment, and the display device further includes: a chip-on-film 7, and one end of the chip-on-film 7 is bound with the bonding sub-area 21, and another end of the chip-on-film 7 is bound with a driving circuit board. The driving circuit board may be provided with a ground terminal, and the reference signal terminal is electrically coupled to the ground terminal on the driving circuit board through the chip-on-film 7.

Specifically, the reference signal terminal may be disposed on the bonding sub-area 21; a ground signal line may be disposed on the chip-on-film 7; one end of the ground signal line is electrically coupled to the reference signal terminal, and another end of the ground signal line is electrically coupled to the ground terminal on the driving circuit board, so that the reference signal terminal is electrically coupled to the ground terminal on the driving circuit board through the chip-on-film 7. Each bonding sub-area 21 may be provided with a bonding electrode thereon, and the one end of the chip-on-film 7 being bound with the bonding sub-area 21 means that a conductive part at the one end of the chip-on-film 7 is electrically coupled to the bonding electrode on the bonding sub-area 21; the another end of the chip-on-film being bound with the driving circuit board means that a conductive part at the another end of the chip-on-film 7 is electrically coupled to a signal output part on the driving circuit board. A signal terminal 4 may be further provided on a side of the bonding area 2 proximal to the display area 1, and in some implementations; the signal terminal 4 is a common signal terminal (VCOM) for providing a common voltage signal to a common signal line in the display area 1. At least a part of the signal terminal 4 may correspond to an interval between the bonding sub-areas 21, for example, at least a part of the signal terminal 4 may be positioned at a side of the first antistatic layer 3 proximal to the display area 1.

By adopting the display device according to the embodiment of the present disclosure, in the display substrate, at least a part of the first antistatic layer 3 is positioned between adjacent ones of the bonding sub-areas 21, so that when static electricity is generated between the adjacent ones of the bonding sub-areas 21, the first antistatic layer 3 can lead the static electricity to the ground terminal of the driving circuit board in time, thereby playing a role of electrostatic protection on the signal terminal 4 and improving the antistatic capacity of the display substrate.

As shown in FIG. 5, the signal terminal 4 is isolated from outside by the first antistatic layer 3, specifically, the first antistatic layer 3 may partially overlap with the chip-on-film 7 adjacent to the first antistatic layer 3, for example, in a first direction, which may be a direction (e.g., an up-down direction in FIG. 5) in which the bonding area 2 and the display area 1 are arranged. The first antistatic layer 3 partially overlaps with the chip-on-film 7 adjacent to the first antistatic layer 3 in the first direction, so that the signal terminal 4 can be completely isolated from outside through the first antistatic layer 3, and the electrostatic protection effect is improved.

Figure 6:
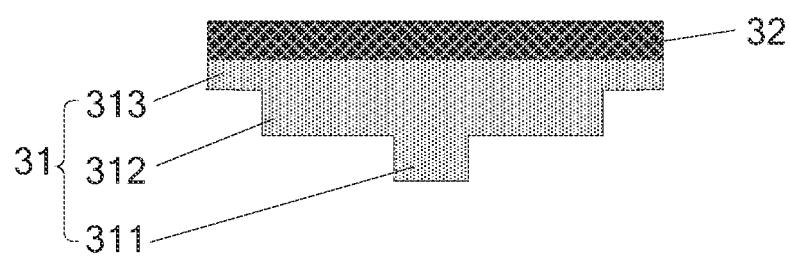
FIG. 6 is a schematic structural diagram of a first antistatic layer according to an embodiment of the present disclosure.

In some implementations, the chip-on-film 7 includes a body portion 72 and a protrusion portion 71, and the protrusion portion 71 of each chip-on-film 7 protrudes from the body portion 72 toward an adjacent chip-on-film 7. FIG. 6 is a schematic structural diagram of a first antistatic layer according to an embodiment of the present disclosure, and referring to FIG. 5 and FIG. 6, the first antistatic sub-layer 31 may include a first antistatic part 311, a second antistatic part 312, and a third antistatic part 313, the second antistatic part 312 is located between body portions 72 of adjacent chip-on-films 7, the first antistatic part 311 is located on a side of the second antistatic part 312 away from the display area 1, at least a portion of the first antistatic part 311 is located between protruding portions 71 of the adjacent chip-on-films 7, and the third antistatic part 313 is located on a side of the second antistatic part 312 proximal to the display area 1. In some implementations, the first antistatic part 311, the second antistatic part 312, and the third antistatic part 313 are formed into an integrated structure as a single piece.

In the embodiment of the present disclosure, the first antistatic layer 3 may further include a second antistatic sub-layer 32, and the second antistatic sub-layer 32 may be located on a side of the third antistatic part 313 proximal to the display area 1. The first antistatic sub-layer 31 and the second antistatic sub-layer 32 are both electrically coupled to the reference signal terminal, and the first antistatic sub-layer 31 and the second antistatic sub-layer 32 may be electrically isolated from each other.

It is to be understood that the above embodiments and implementations are merely illustrative of exemplary embodiments and implementations that have been employed to illustrate the principles of the present disclosure, which, however, is not to be taken as limiting of the present disclosure. It will be apparent to those skilled in the art that various changes and modifications can be made therein without departing from the spirit and scope of the present disclosure, and these changes and modifications are to be considered within the scope of the present disclosure.

The invention claimed is:

1. A display substrate, comprising a display area and a bonding area positioned on a side of the display area, the bonding area comprises a plurality of bonding sub-areas arranged at intervals, the bonding sub-areas are arranged along a direction in which an edge of the display area extends and configured for bonding a chip-on-film, wherein,
   the bonding area is provided with a first antistatic layer thereon, at least a part of the first antistatic layer is located between adjacent ones of the bonding sub-areas, and the first antistatic layer is electrically coupled to a reference signal terminal,
   the first antistatic layer comprises a first antistatic sub-layer and a second antistatic sub-layer, the second antistatic sub-layer is disposed on a side of the first antistatic sub-layer proximal to the display area, and the first antistatic sub-layer and the second antistatic sub-layer are both electrically coupled to the reference signal terminal,
   the first antistatic sub-layer is disposed electrically isolated from the second antistatic sub-layer.

2. The display substrate of claim 1, further comprising a signal terminal configured to provide a display signal to the display area, the signal terminal being located at a side of the bonding area proximal to the display area, and the signal terminal being located between the display area and the first antistatic layer and isolated from outside by the first antistatic layer.

3. The display substrate of claim 1, wherein the reference signal terminal is disposed on the bonding sub-area and configured to be electrically connectable to an external ground terminal through the chip-on-film.

4. The display substrate of claim 1, wherein the first antistatic layer is provided with a first through hole therein.

5. The display substrate of claim 4, wherein the first through hole is a stripe through hole.

6. The display substrate of claim 1, further comprising a first frame area, a second frame area, and a third frame area coupled in sequence, the first frame area, the second frame area, the third frame area, and the bonding area surround the display area, and each of the first frame area, the second frame area, and the third frame area is provided with a second antistatic layer thereon, and the second antistatic layer is electrically coupled to the reference signal terminal.

7. The display substrate of claim 6, further comprising a conductive layer comprising a connection line and an auxiliary conductive portion coupled in parallel to the connection line, the second antistatic layer being electrically coupled to the reference signal terminal through the connection line.

8. The display substrate of claim 6, wherein a second through hole is formed at a position of the second antistatic layer proximal to a corner of the display substrate, and an alignment mark is formed in the second through hole for position alignment and adjustment.

9. A display device, comprising the display substrate of claim 1,
the display device further comprises a chip-on-film, one end of the chip-on-film is bound with the bonding sub-area, and another end of the chip-on-film is bound with a driving circuit board;
the driving circuit board is provided with a ground terminal thereon, and the reference signal terminal is electrically coupled to the ground terminal on the driving circuit board through the chip-on-film.

10. The display device of claim 9, wherein the first antistatic layer partially overlaps the chip-on-film adjacent to the first antistatic layer in a first direction, the first direction being a direction in which the bonding area and the display area are arranged.

11. The display device of claim 9, wherein the chip-on-film comprises a body portion and a protrusion portion, the protrusion portion protruding from the body portion toward the chip-on-film adjacent thereto;
the first antistatic sub-layer comprises a first antistatic part, a second antistatic part and a third antistatic part, the second antistatic part is positioned between body portions of adjacent chip-on-films, the first antistatic part is positioned on a side, away from the display area, of the second antistatic part, at least a part of the first antistatic part is positioned between protruding portions of the adjacent chip-on-films, and the third antistatic part is positioned on a side, proximal to the display area, of the second antistatic part.

12. The display device of claim 11, wherein the first antistatic part, the second antistatic part, and the third antistatic part are formed into an integrated structure as a single piece.

13. A display substrate, comprising a display area and a bonding area positioned on a side of the display area, the bonding area comprises a plurality of bonding sub-areas arranged at intervals, the bonding sub-areas are arranged along a direction in which an edge of the display area extends and configured for bonding a chip-on-film, wherein,
the bonding area is provided with a first antistatic layer thereon, at least a part of the first antistatic layer is located between adjacent ones of the bonding sub-areas, and the first antistatic layer is electrically coupled to a reference signal terminal,
the display substrate further comprises a first frame area, a second frame area, and a third frame area coupled in sequence, the first frame area, the second frame area, the third frame area, and the bonding area surround the display area, and each of the first frame area, the second frame area, and the third frame area is provided with a second antistatic layer thereon, and the second antistatic layer is electrically coupled to the reference signal terminal,
the display substrate further comprises a conductive layer comprising a connection line and an auxiliary conductive portion coupled in parallel to the connection line, the second antistatic layer being electrically coupled to the reference signal terminal through the connection line.

14. A display substrate, comprising a display area and a bonding area positioned on a side of the display area, the bonding area comprises a plurality of bonding sub-areas arranged at intervals, the bonding sub-areas are arranged along a direction in which an edge of the display area extends and configured for bonding a chip-on-film, wherein,
the bonding area is provided with a first antistatic layer thereon, at least a part of the first antistatic layer is located between adjacent ones of the bonding sub-areas, and the first antistatic layer is electrically coupled to a reference signal terminal,
further comprising a first frame area, a second frame area, and a third frame area coupled in sequence, the first frame area, the second frame area, the third frame area, and the bonding area surround the display area, and each of the first frame area, the second frame area, and the third frame area is provided with a second antistatic layer thereon, and the second antistatic layer is electrically coupled to the reference signal terminal, and,
a second through hole is formed at a position of the second antistatic layer proximal to a corner of the display substrate, and an alignment mark is formed in the second through hole for position alignment and adjustment.

* * * * *